United States Patent
Mathur et al.

(10) Patent No.: US 7,350,168 B1
(45) Date of Patent: Mar. 25, 2008

(54) SYSTEM, METHOD AND COMPUTER PROGRAM PRODUCT FOR EQUIVALENCE CHECKING BETWEEN DESIGNS WITH SEQUENTIAL DIFFERENCES

(75) Inventors: Anmol Mathur, San Jose, CA (US); Nikhil Sharma, Milpitas, CA (US); Deepak Goyal, Santa Clara, CA (US); Gagan Hasteer, San Jose, CA (US); Rajarshi Mukherjee, San Jose, CA (US)

(73) Assignee: Calypto Design Systems, Inc., Santa Clara, CA (US)

( * ) Notice: Subject to any disclaimer, the term of this patent is extended or adjusted under 35 U.S.C. 154(b) by 162 days.

(21) Appl. No.: 11/129,238

(22) Filed: May 12, 2005

(51) Int. Cl.
*G06F 17/50* (2006.01)
(52) U.S. Cl. .............................. 716/5; 716/6
(58) Field of Classification Search ................ 716/4–6
See application file for complete search history.

(56) References Cited

U.S. PATENT DOCUMENTS

2002/0059481 A1* 5/2002 Nunally ........................ 710/5
2003/0217345 A1* 11/2003 Rajsuman et al. ............. 716/6
2004/0054875 A1* 3/2004 Segelken ..................... 712/214

OTHER PUBLICATIONS

Corno, F., et al., "Simulation based sequential equivalence checking of RTL VHDL", IEEE, 1999. pp. 351-354.*
Cabodi, G. et al., "Sequential circuit diagnosis based on formal verification techniques", IEEE 1992., pp. 187-196.*
Corno, F. et al., "Verifying the equivalence of sequential circuits with benetic algorithms", IEEE, 1999. pp. 1293-1298.*
Corno, F. et al., "On the test of micorprocessor cores", IEEE, 2001. pp. 209-213.*
Corno, F., "Automatic test program generatin from RT-level microprocessor descriptions", IEEE. @002. pp. 1-6.*

* cited by examiner

*Primary Examiner*—Stacy Whitmore
(74) *Attorney, Agent, or Firm*—Zilka-Kotab, PC (57) ABSTRACT

A system, method and computer program product are provided for equivalency checking between a first design and a second design having sequential differences. To accomplish the equivalency checking, sequential differences between a first design and a second design are identified. It is then determined whether the first design and the second design are equivalent, utilizing the identified sequential differences.

26 Claims, 6 Drawing Sheets

|         | A₀ | x | x | x | A₁ | x | x | x | A₂ | x | x | x | A₃ |
|---------|----|----|----|----|----|----|----|----|----|----|----|----|----|
| Inputs  | B₀ | x | x | x | B₁ | x | x | x | B₂ | x | x | x | B₃ |
|         | C₀ | x | x | x | C₁ | x | x | x | C₂ | x | x | x | C₃ |
|         | D₀ | x | x | x | D₁ | x | x | x | D₂ | x | x | x | D₃ |
|         | x | x | x | x | F₀ | x | x | x | F₁ | x | x | x | F₂ |
| Outputs | x | x | x | x | G₀ | x | x | x | G₁ | x | x | x | G₂ |
|         | x | x | x | x | H₀ | x | x | x | H₁ | x | x | x | H₂ |
|         | x | x | x | x | I₀ | x | x | x | I₁ | x | x | x | I₂ | a) parallel inputs and outputs

| Inputs  | A₀ | B₀ | C₀ | D₀ | A₁ | B₁ | C₁ | D₁ | A₂ | B₂ | C₂ | D₂ | A₃ |
|---------|----|----|----|----|----|----|----|----|----|----|----|----|----|
|         | x | x | x | x | F₀ | x | x | x | F₁ | x | x | x | F₂ |
| Outputs | x | x | x | x | G₀ | x | x | x | G₁ | x | x | x | G₂ |
|         | x | x | x | x | H₀ | x | x | x | H₁ | x | x | x | H₂ |
|         | x | x | x | x | I₀ | x | x | x | I₁ | x | x | x | I₂ | b) serial inputs, parallel outputs

|         | A₀ | x | x | x | A₁ | x | x | x | A₂ | x | x | x | A₃ |
|---------|----|----|----|----|----|----|----|----|----|----|----|----|----|
| Inputs  | B₀ | x | x | x | B₁ | x | x | x | B₂ | x | x | x | B₃ |
|         | C₀ | x | x | x | C₁ | x | x | x | C₂ | x | x | x | C₃ |
|         | D₀ | x | x | x | D₁ | x | x | x | D₂ | x | x | x | D₃ |
| Outputs | x | F₀ | G₀ | H₀ | I₀ | F₁ | G₁ | H₁ | I₁ | F₂ | G₂ | H₂ | I₂ | c) parallel inputs, serial outputs

SYSTEM, METHOD AND COMPUTER PROGRAM PRODUCT FOR EQUIVALENCE CHECKING BETWEEN DESIGNS WITH SEQUENTIAL DIFFERENCES

BACKGROUND AND FIELD OF THE INVENTION

The present invention relates to equivalence checking, and more particularly, to equivalence checking between designs.

SUMMARY

A system, method and computer program product are provided for equivalency checking between a first design and a second design having sequential differences. To accomplish the equivalency checking, sequential differences between a first design and a second design are identified. It is then determined whether the first design and the second design are equivalent, utilizing the identified sequential differences.

DETAILED DESCRIPTION

Figure 1:
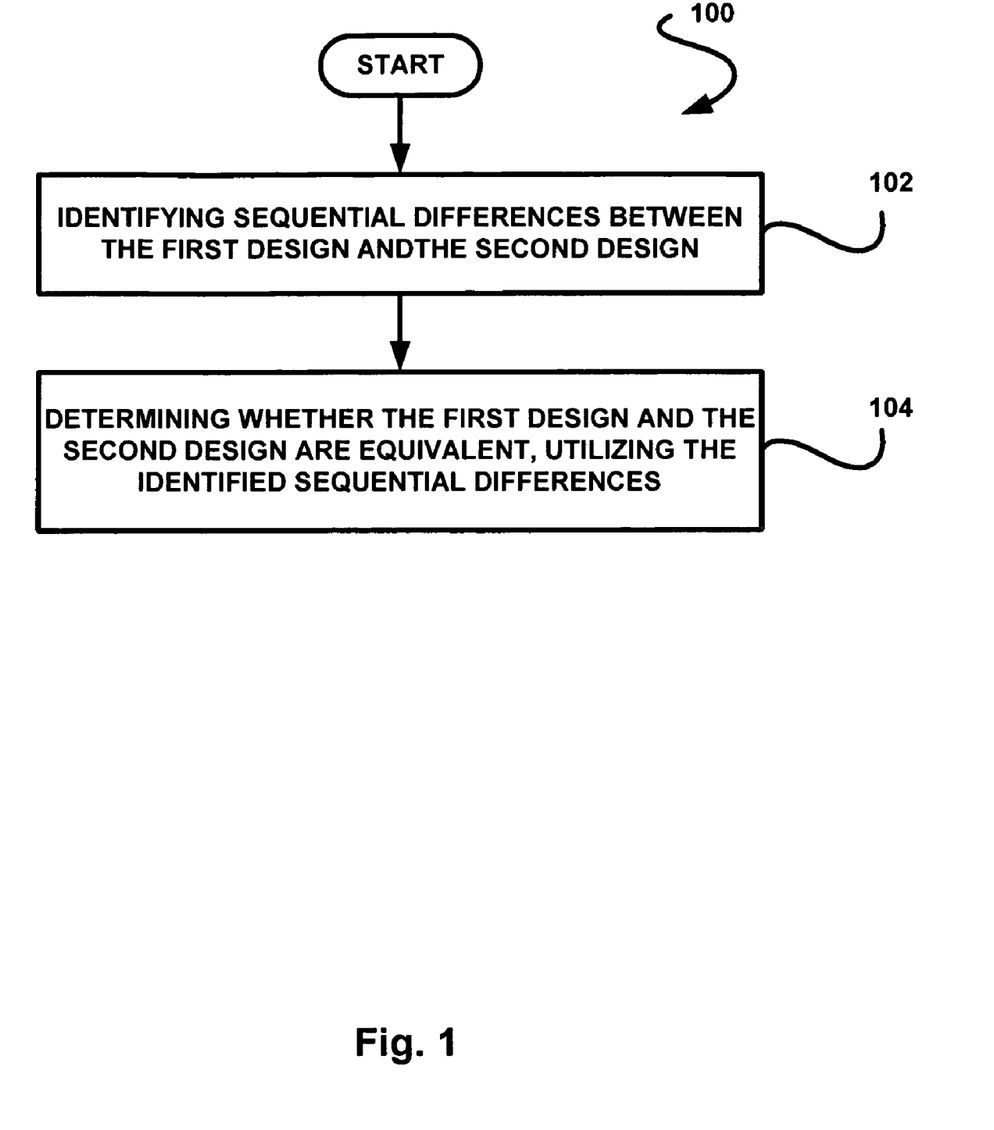
FIG. 1 illustrates a method for equivalency checking between a first design and a second design, in accordance with one embodiment.

FIG. 1 illustrates a method 100 for equivalency checking between a first design and a second design, in accordance with one embodiment. In the context of the present description, such first and second design may include any software and/or hardware designs that are different in any respect. Just by way of example, the first design and the second design may differ with respect to a level of abstraction. In such example, the first design may include a specification design, and the second design may include an implementation design. Again, however, any software and/or hardware designs may be used that are different in any respect.

As shown in operation 102, sequential differences between the first design and the second design are identified. In the context of the present description, sequential differences may refer to any difference between the first and second design in terms of any aspect of timing, temporal characteristics, etc. associated with the architecture and/or functionality of the designs. Further, such identification of the sequential differences may be done in any desired manual and/or automated manner that is capable of identifying such differences.

Next, operation 104, it is then determined whether the first design and the second design are equivalent, utilizing the identified sequential differences. In the present description, the term equivalent may refer to a situation where given two corresponding inputs (but not necessarily at the same point in time), the same output is produced (but not necessarily at the same point in time). Also, such determination of operation 104 may involve any desired manual and/or automated processing that is capable of determining whether at least one aspect of the first design and the second design are equivalent.

It should be strongly noted that the foregoing technique may be implemented in any desired environment. Just by way of example, the method 100 may be used for equivalency checking with respect to a hardware environment where the first specification design may be a system level model (SLM) design, and the second implementation design may be a register transfer level (RTL) design. Of course, still other environments are contemplated such as RTL-RTL equivalency checking, as well as any other desired equivalency checking.

More illustrative information will now be set forth regarding various optional features with which the foregoing method 100 may or may not be implemented in a hardware SLM-RTL design environment, per the desires of the user. It should be strongly noted that the following information is set forth for illustrative purposes and should not be construed as limiting in any manner. Any of the following features may be optionally incorporated with or without the exclusion of other features described hereinabove.

Figure 2:
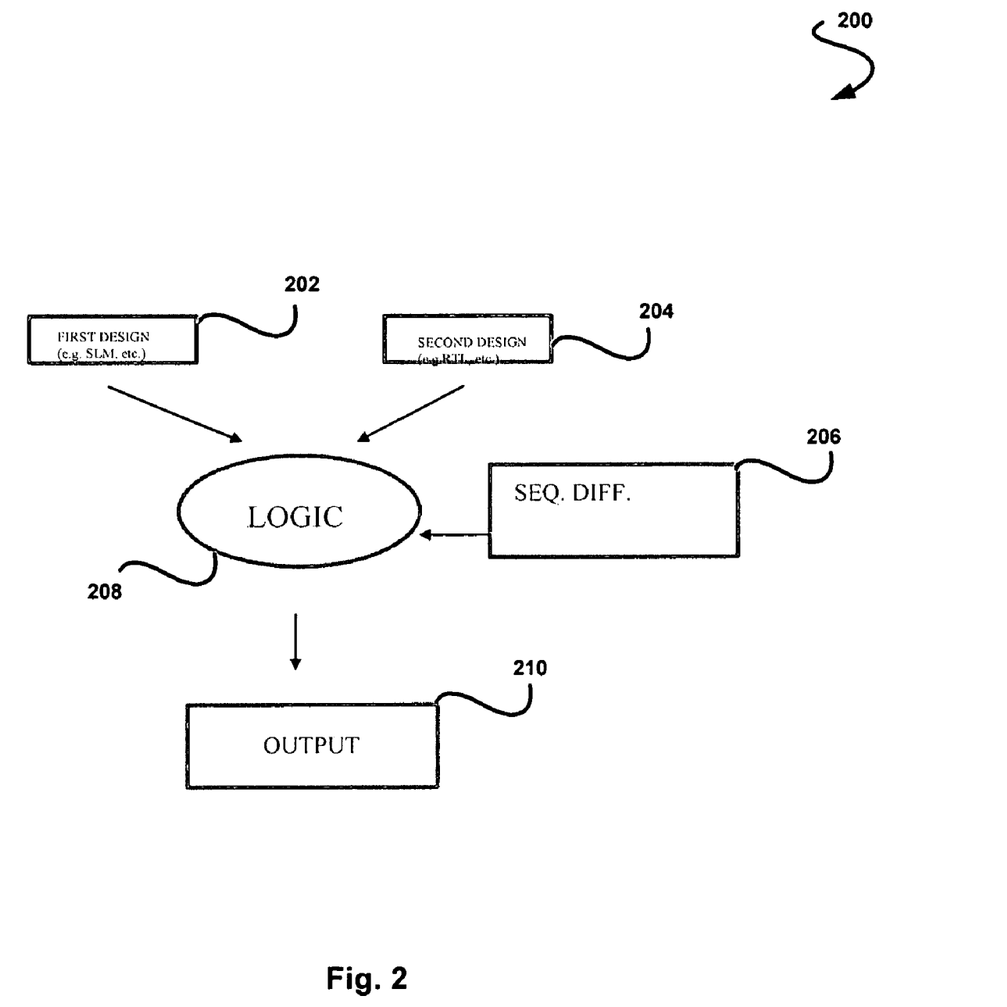
FIG. 2 illustrates an exemplary flow for equivalency checking between a first and second hardware design, in accordance with one embodiment.

FIG. 2 illustrates an exemplary flow 200 for equivalency checking between a first and second hardware design, in accordance with one embodiment. As an option, the flow 200 may be implemented in the context of the method 100 of FIG. 1. Of course, however, the flow 200 may be carried out in any desired environment.

As shown, a first and second design 202, 204 may be input to logic 208. In an SLM-RTL design environment, the SLM design may, in one embodiment, include an abstract, functional model of a design that removes a lot of micro-architectural details present in an RTL design. The SLM design may, however, include a notion of a system-level clock that defines what happens in one system-level cycle. In addition, such design may also have a notion of concurrency and have functional units that are operating concurrently. So, in general, the logic 208 may expect a SLM that is timed, in at least one aspect.

Since the SLM is timed, in one embodiment, it may be viewed as a finite-state machine (FSM) where the states may be defined by variables that persist from one system-level cycle to the next. In each system-level cycle, the FSM may compute some outputs based on current values of the inputs and the state of the FSM and may also update the state. Similarly, the RTL may be viewed as a FSM that works on an RTL clock. Thus, the RTL FSM may be a refinement of the SLM FSM and a single transition in the SLM FSM may correspond to a transition through a set of states in the RTL FSM. The logic 208 may handle multiple clocks, in one optional embodiment.

Further received by the logic 208 is a plurality of sequential differences 206 between the first design and the second design 202, 204. It should be noted that the sequential differences may be specified using any desired technique. For example, sequential differences may be specified by using the notions of waveforms, constraints, maps and transactions. A waveform is a sequence of values. Waveforms can be transformed via temporal transformations to create new waveforms. The association of a waveform to a design signal creates a constraint. Maps provide a mechanism to specify the relationship between corresponding input signal pairs and output signal pairs. Both constraints and maps can be scoped with respect to transactions or can have global scope.

These concepts and specific exemplary mechanisms to specify these are described in Appendix A. It should be strongly understood that such examples are set forth for illustrative purposes only and should not be construed as limiting in any manner whatsoever. Of course, any technique capable of specifying such sequential differences may be employed per the desires of the user.

In use, it may be determined by the logic 208 whether the first design and the second design 202, 204 are equivalent by mapping inputs associated with the first design and the second design 202, 204 utilizing the specified sequential differences. In other words, sequential differences between the first design and the second design 202, 204 may be taken into account to determine a relationship among the inputs that are required for producing an equivalent output.

Figure 3:
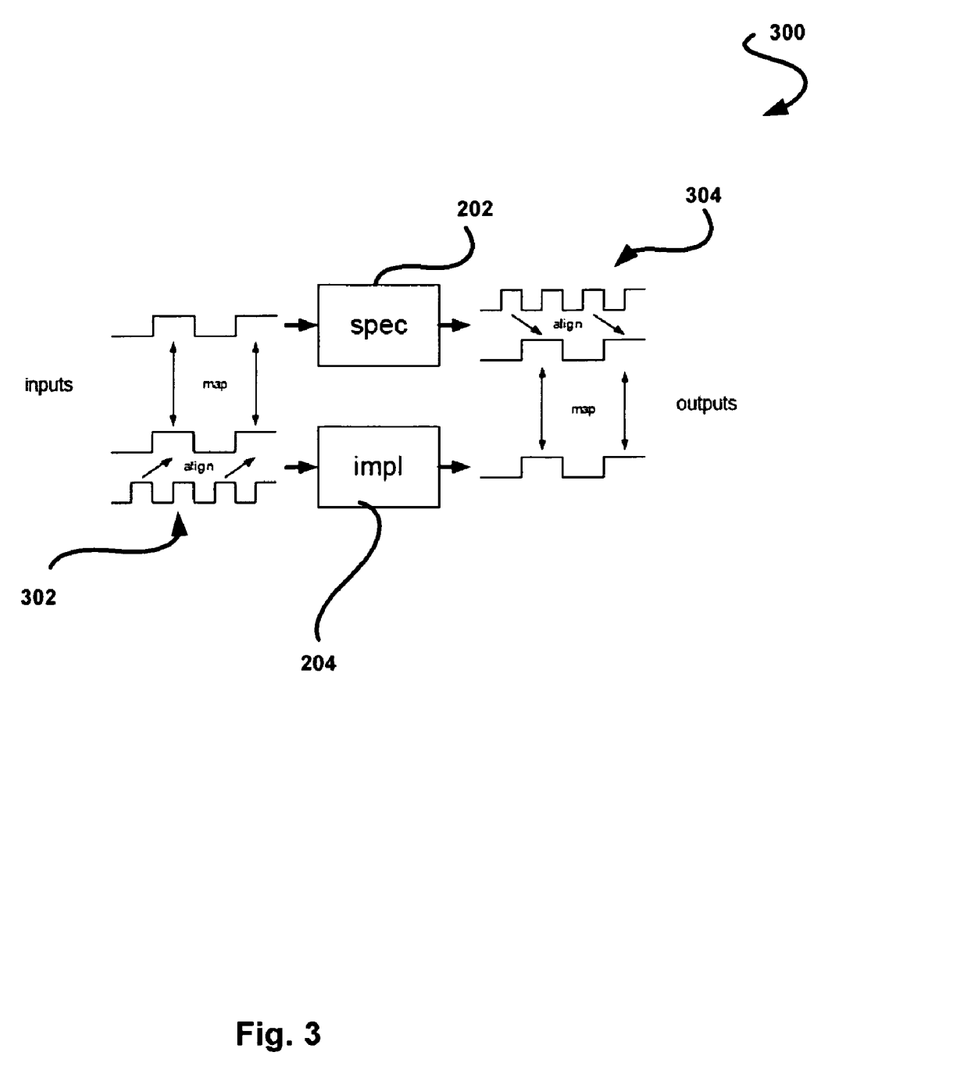
FIG. 3 illustrates a mapping among a first design and a second design, in accordance with one embodiment.

As an option, the specified sequential differences may further involve a mapping among the outputs of the first design and the second design 202, 204. FIG. 3 illustrates such mapping among the first design and the second design 202, 204, in accordance with one embodiment. As shown, a first input mapping 302 and a second output mapping 304 are provided. To this end, as will soon become apparent, such mapping may be used to determine whether outputs of the first design and the second design 202, 204 are equivalent.

As mentioned earlier, the term equivalent may refer to a situation where given two corresponding inputs (but not necessarily at the same point in time), the corresponding output is produced (but not necessarily at the same point in time). Again, the input sequences of the SLM and RTL are "corresponding" and not necessarily "identical," since the RTL may have serial or fixed width parallel interfaces that accept data over multiple RTL cycles whereas the SLM may accept all of the data in one SLM cycle, etc.

With continuing reference to FIG. 2, based on the results of the equivalency checking, various outputs 210 may result. For example, if it is determined that the first design and the second design are equivalent, a proof of the equivalency may be output. On the other hand, if it is determined that the first design and the second design are not equivalent, a counter example may be output for illustrating the non-equivalency. Such counter example may be capable of being utilized for correcting the non-equivalency. More information regarding such output 210 will be set forth hereinafter in greater detail.

As mentioned earlier, in the context of the present description, sequential differences may refer to any difference between the first and second design in terms of any aspect of timing, temporal characteristics, etc. associated with the architecture and/or functionality of the designs. In one embodiment, such sequential differences may include a latency associated with the first design and the second design, a frequency at which inputs of the first design and the second design are sampled, a frequency at which outputs of the first design and the second design are produced, differences in a state mapping associated with the first design and the second design, and/or a protocol associated with the first design and the second design. Such protocol may include an input/output protocol. For example, a first protocol of the first design may include a serial protocol, and a second protocol of the second design may include a parallel protocol. Of course, such list of differences is illustrative in nature, and not exhaustive in any manner.

Further, it should be noted that, in the context of the present description, latency may refer to a number of cycles it takes for a design to process an input and produce an output based on that input. Further, throughput may refer to the frequency at which the design samples its input or produces its output. Of course, these are not necessarily fixed numbers for a design and designs can have data dependant latency or throughput.

Sequential differences, such as those mentioned hereinabove, may reflect any variety of differences between the first and second design. For example, the sequential differences may reflect pipelining differences associated with the first design and the second design, differences in scheduling of computations associated with the first design and the second design, and/or micro-architecture differences associated with the first design and the second design. More information on such differences will be set forth hereinbelow in greater detail.

With respect to pipelining differences, pipelines are often added to a design to meet throughput requirements. Pipeline refinements include inserting or modifying the number of pipeline stages in data and control paths. Information on throughput and latency may be used by the equivalency checking logic 208 to align design interfaces and compare the designs for transactional equivalence. A common scenario might be to add a pipeline stage to a key datapath, increasing the implementation latency by one, followed by equivalency checking logic run to confirm that the longer pipeline still implements the original functional behavior.

Figure 4A:
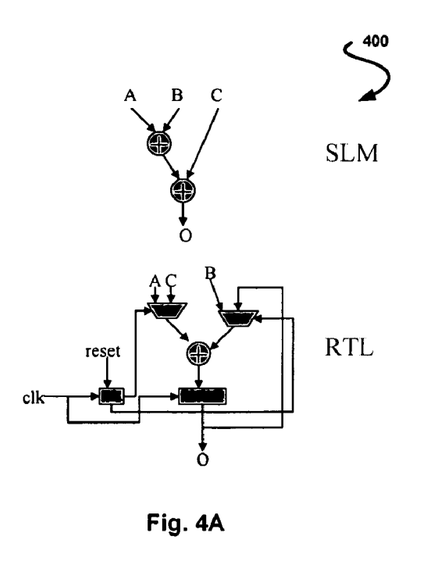
FIG. 4A shows an exemplary difference in scheduling of computations among a first and second design, in accordance with one embodiment.

FIG. 4A shows an exemplary difference 400 in scheduling of computations among a first and second design, in accordance with one embodiment. As shown, the SLM design may perform a computation in parallel while the RTL design schedules operations in multiple cycles with a scheduling FSM. Such difference introduces additional states due to scheduling. Further, some operations that can use the same resource may become temporally disjointed, resulting in resource sharing.

Figure 4B:
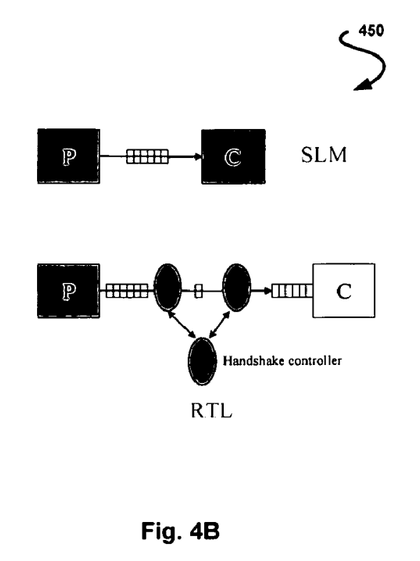
FIG. 4B shows a micro-architecture difference, in accordance with one embodiment.

With respect to micro-architecture differences, FIG. 4B shows a micro-architecture difference 450, in accordance with one embodiment. Typically, a RTL has detailed micro-architectures like scan chains, sleep mode logic, clock gating, memory caches, bus-based communication along with bus arbitration, serial communication with handshakes, etc., all of which may constitute exemplary micro-architecture differences, which may result in sequential differences.

More information regarding sequential differences will now be set forth hereinafter in greater detail, in the specific context of an SLM-RTL design environment.

Due to the presence of sequential divergence between the SLM and RTL designs, information may be required regarding when to compare outputs of the SLM and RTL designs. Such information may be viewed as specifying a "transaction" on the SLM and RTL design. In one exemplary embodiment, a transaction may include the properties set forth in Table 1.

TABLE 1

Encapsulates one or more units of computation for a block under consideration

It is self-contained and cleans up any transient states that would interfere with the proper execution of the current or any future transactions Table 2 sets forth some additional examples of transactions, in accordance with one optional embodiment.

TABLE 2

| | |
|---|---|
| Discrete Cosine Transform (DCT) block: | the computation of DCT for one 8 × 8 block could be a transaction in the SLM and RTL FSMs, since this is the smallest unit of computation at the end of which the SLM and the RTL have outputs that are comparable. |
| Microprocessor: | typically the SLM and RTL can be synchronized after the execution of individual instructions. Hence, the execution of one instruction could be a transaction. Also, a bigger transaction could be composed for a microprocessor by saying that a sequence of k instruction executions constitute one transaction. Such a bigger transaction for a microprocessor would be useful in verifying the interactions between instructions in the instruction pipeline in the RTL and showing that the pipelining does not alter the correctness of the execution of each individual instruction. |
| Network processor: | a transaction could be the routing of a single packet from the input interface to the output. |
| Memory: | A read or a write on a memory address. |

Specifying transaction does not necessarily require an understanding of the underlying state machines, but rather knowledge of when the machines can be compared in terms of their outputs or states. While a transaction may capture a subset of behaviors of a design, the transaction may be defined to include all interesting behaviors. In one exemplary trivial case where the SLM and RTL designs are identical state machines, the transaction may be one clock cycle.

Table 3 illustrates exemplary information for specifying a transaction for an FSM.

TABLE 3

| | | |
|---|---|---|
| 1. | Reset: | There is a sequence of inputs that specify the beginning of a transaction. For example, there may be an explicit strobe signal that needs to go high to indicate that a new DCT computation is starting. This signal may initialize some scheduling state machines to start accepting new data and initialize the machine to perform the DCT computation. |
| 2. | Constraints and maps: | These are constraints that need to be true during the execution of a transaction for the transaction to execute properly. These are constraints on inputs that need to be asserted for the duration of the transaction. |
| 3. | Ready-for-next-transaction condition: | This specifies when the next transaction can start. In pipelined designs, transactions can overlap and hence new transactions can start before the previous one has ended. Also, in situations where the delay of a transaction is variable (dependent on the input data or some internal state), then the design may have a signal to indicate to the environment that it can accept a new transaction. |
| 4. | Output checks: | This specifies the condition when the output of the transaction is valid. It can also be viewed as specifying the end of the transaction, since the output/state is valid and comparable to that in the other model at the end of a transaction. |

Figure 5:
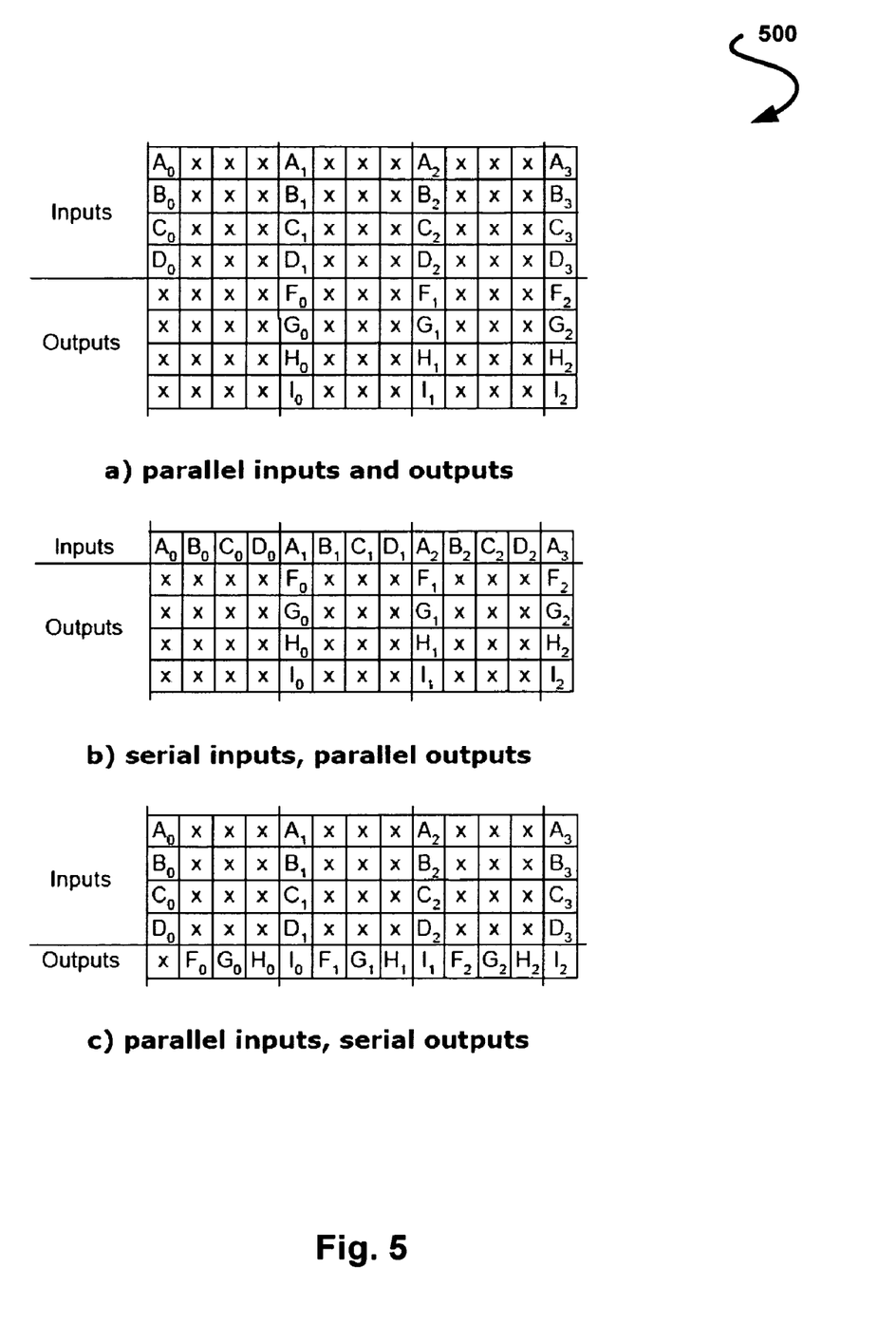
FIG. 5 shows a transaction-accurate mapping, in accordance with one embodiment.

FIG. 5 shows a transaction-accurate mapping 500, in accordance with one embodiment. Once transactions have been defined in both the SLM and RTL models, the equivalency checking logic may validate the equivalence of the models with respect to that transaction or generate a counter-example illustrating a scenario where the output/state check for the transaction fails to match, as mentioned previously. The equivalency checking logic verifies formally the equivalence of the SLM and RTL transactions. Thus, the notion of transaction allows the user to control the granularity at which the equivalence between the SLM and RTL is done and it allows for verification of a subset of the entire functionality in cases where verifying the entire functionality in one shot is not tractable.

The various embodiments set forth herein may be implemented utilizing hardware, software, or any desired combination thereof. For that matter, any type of logic may be utilized which is capable of implementing the various functionality set forth herein.

Figure 6:
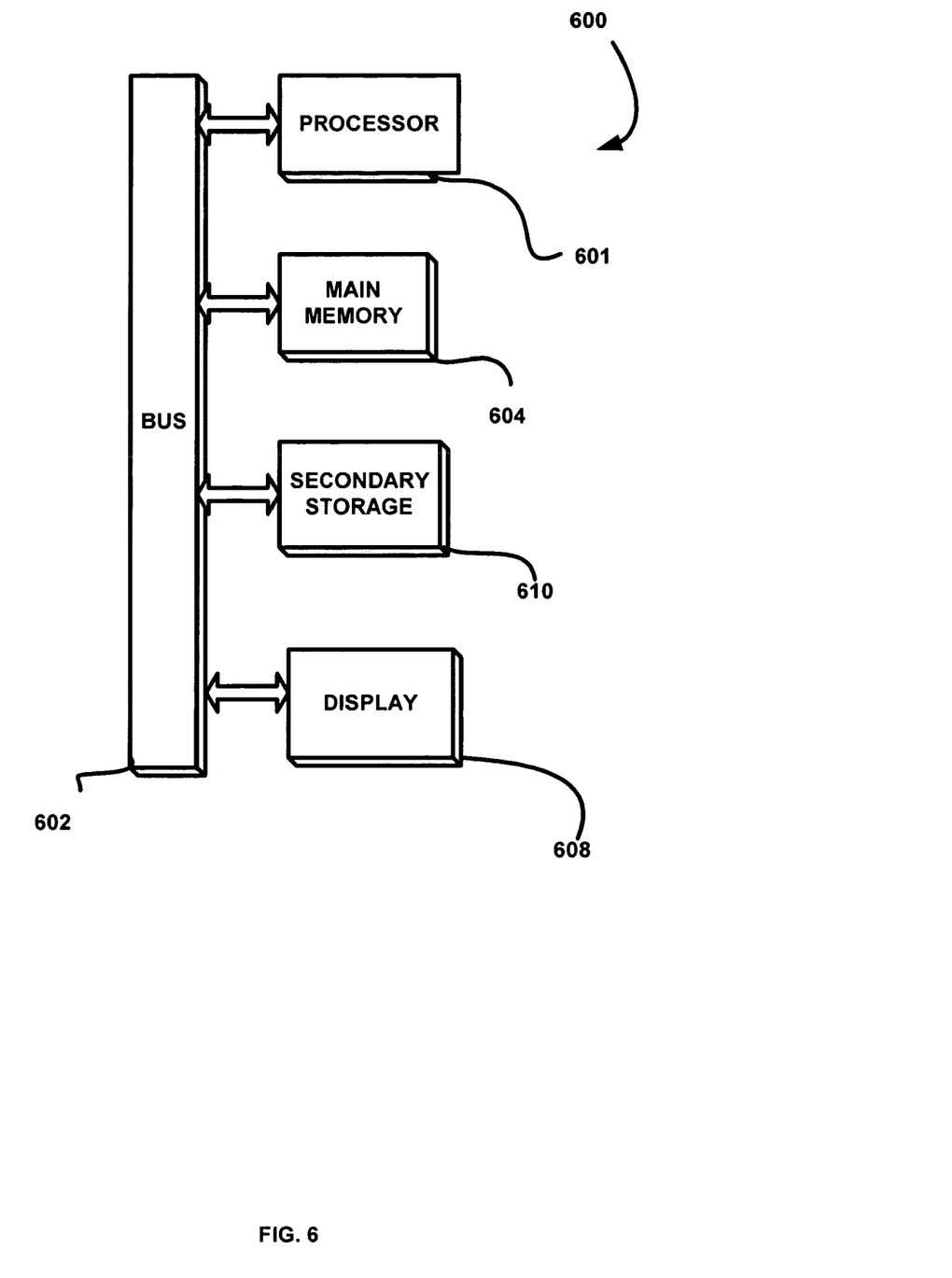
FIG. 6 illustrates an exemplary computer system with which the equivalence checking may be carried out, in accordance with one embodiment.

For example, FIG. 6 illustrates an exemplary computer system 600 with which the equivalence checking may be carried out. As shown, a computer system 600 is provided including one or more processors, such as processor 601, which is connected to a communication bus 602. The computer system 600 also includes a main memory 604. Control logic (software) and data are stored in the main memory 604 which may take the form of random access memory (RAM). The computer system 1100 also includes a display 1108, i.e. a computer monitor, as well as any other unillustrated I/O devices.

The computer system 600 may also include a secondary storage 610. The secondary storage 610 includes, for example, a hard disk drive and/or a removable storage drive, representing a floppy disk drive, a magnetic tape drive, a compact disk drive, etc. The removable storage drive reads from and/or writes to a removable storage unit in a well known manner. Computer programs, or computer control logic algorithms, may be stored in the main memory 604 and/or the secondary storage 610. Such computer programs, when executed, enable the computer system 600 to perform various functions, including the above-described equivalency checking. Memory 604 and storage 610 are thus examples of computer-readable media.

APPENDIX A

Appendix A sets for exemplary specifications for sequential differences. It should be strongly understood that such examples are set forth for illustrative purposes only and should not be construed as limiting in any manner whatsoever. Of course, any technique capable of specifying such sequential differences may be employed.

create_constraint create_constraint—Creates a constraint on an input port or adds a transactor to constrain a set of ports.

Synopsis create_constraint [-name <name>] -spec | -impl [-reset]
    [-transaction_scope |- global_scope]
    [-num_samples <num_samples>] { -waveform <waveform> | -module <module> }
    <port_description>

-name <name>
    Name for the constraint. If not specified, a unique name is automatically generated. The name is returned as the result of the command. Wildcard substitution may be used to generate a list of names corresponding to ports in a wildcarded port description.

-spec | -impl
    Associate this constraint with the specification or implementation design. This is required for transactor constraints.

-reset
    Apply this constraint during reset. Otherwise the constraint is applied during normal operation.

-transaction_scope | -global_scope

If -transaction_scope, apply this constraint at the beginning of each transaction. This is the default. If -global_scope, apply this constraint once only beginning after reset. Constraint scoping is only appropriate for waveform-type constraints.

-num_samples <num_samples>
Number of samples to make per transaction. Defaults to the throughput of the design. This parameter should only be specified for waveform constraints.

-waveform <waveform>
Specify a waveform constraint and the name of a waveform used to constrain an input port.

-module <module>
Specify a transactor constraint and the name of a module from the cons library used to create a transactor instance.

<port_description>
If a waveform constraint, the name of the input port or black-box output constraint being constrained. Wildcarding may be used to generate a list of ports. If a transactor constraint, the port connection description of the module instance, using a Verilog style, either as an ordered port list or a list of named port connections.

The create_constraint command constrains an input port by associating a waveform with the input port or constrains a set of ports by attaching a transactor module to the ports.

Input ports may not be multiply constrained. Input ports constrained by transactors cannot be constrained or input mapped.

The name of the created constraint is returned.

Usage

The create_constraint command constrains an input port by associating a waveform with the input port or constrains a set of ports by attaching a transactor to the ports.

Waveform Constraint

For a waveform constraint, the <port_description> refers to a single input port or a sub-field of an input port. If an input port, in, of the specification top module instance, is 16 bits wide, then spec.in [0] refers to the least significant bit of the port, and create_waveform -name always_zero width 1 0+
create_constraint -spec spec.in\[0\] waveform always_zero creates a constraint which constrains the least significant bit of the specification in port to a waveform which is always zero.

By default, the constraint is applied with transaction scope. With transaction scope, the constraining waveform is restarted at the beginning of each transaction. With global scope, the constraint is applied once only and immediately after reset. Since transaction scope is the default scope, -transaction_scope is unnecessary, but may be used to explicitly document the intended scope.

If -reset is specified, the constraint is applied during reset instead of during normal operation.

Ports used only for reset should be constrained to non-reset values for normal operation to keep the design out of reset during equivalence checking.

Transactor Constraint

For a transactor constraint, a module is instantiated and waveforms are associated with the ports of the constraining module through the <port_description>. For example, consider the following Verilog module read into the constraints library:

module mod256(out, in);
  output [15:0] out;
  input [15:0] in;
  assign out = {8'b0, in[7:0]};
endmodule The constraint command:
create_constraint -name c_low -spec -module cons.mod256 { spec.in2 spec.in1} creates a constraint named c_low which constrains the waveform associated with the spec.in2 port to be the lower 8 bits of the waveform associated with spec.in1 port.

create_map create_map—Maps a waveform, port or flop from the specification design to a waveform, port, or flop from the implementation design.

Synopsis create_map [-name <name>] [-transaction_scope | -global_scope] { -input | -output | -flop }
  [-num_samples <num_samples>] [-valid <valid>]
  <spec_waveform>
<impl_waveform>

-name <name>
Name for the map being created. If not specified, a unique name is automatically generated. Wildcard substitution may be used to generate a list of names corresponding to matching pairs in a wildcarded description. The name or list of names is returned as the result of the command.

-input | -output | -flop
The type of map. Either input, output, or flop type must be specified.

-transaction_scope
Apply input constraints to this map at the beginning of each transaction. This is the default and only valid for input maps.

-global_scope
For input maps, apply input constraints to this map once only beginning after reset. This is only valid for input maps.

-num_samples <num_samples>
Number of samples to make per transaction. For input maps, defaults to the minimum throughput value of both designs. For output and flop maps, defaults to 1.

-valid <valid>
Guard the output check with the <valid> signal.

<spec_waveform> <impl_waveform>
Names of waveforms being mapped between designs. The order is not important. Wildcard substitution may be used to map more than one pair of waveforms or ports.

The create_map command maps a waveform, port, or flop from the specification design to a waveform, port, or flop from the implementation design. Ports may be input or output ports which were not specified as clock ports or constrained input ports.

The name of the map is returned.

Usage

The create_map command is used to map inputs, outputs, or flops between designs.

Input Maps

By default, mapped input waveforms are applied with transaction scope. With transaction scope, the mapped waveforms are restarted at the beginning of each transaction. With global scope, the waveforms are applied once only and immediately after reset. Global scope is valid only for input maps. Since transaction scope is the default scope, -transaction_scope is unnecessary, but may be used to explicitly document the intended scope.

By default, input ports with the same name in both designs are implicitly mapped. Implicit maps are applied from the beginning cycle of a transaction with a default number of samples equal to the minimum throughput of the two designs. An implicit map may be removed using the unmap command.

More complex relationships between ports are specified using waveforms. Waveforms may be used to aggregate or select portions of ports, to transform port values, or to shift or sample port values. For example, a 16 bit input port of the specification design could be mapped to two 8 bit input ports in the implementation design:

create_waveform -name impl_in -aggregate {impl.in1 impl.in2} create_map -input spec.in impl_in

Output Maps

Mapped output waveforms are compared with transaction scope. The mapped waveforms are restarted at the beginning of each transaction.

By default, output ports with the same name in both designs are implicitly mapped. Implicit maps are compared output latency cycles after the beginning of a transaction.

Sequentially different behavior can be captured by using appropriately created waveforms, for example:

create_waveform -name spec_sample -sample_freq 2 \
-sample_start 0 -sample_end 5 spec.data_out
create_waveform -name impl_sample -sample_freq 3 \
-sample_start 0 -sample_end 8 impl.data_out
create_map -output -num_samples 3 spec_sample impl_sample This example compares two sampled outputs. The outputs are checked three times per transaction. The specification's data_out port is compared in cycles 0, 2, and 4 with the implementation's data_out port in cycles 0, 3, 6. The implicit map by name for the data_in ports is replaced by this map.

The -valid option is used to produce conditional checks on the output map. For the previous example, replacing the map with:

create_map -output -num_samples 3 -valid impl.valid spec_sample impl_sample will compare the sampled waveforms only in output check cycles when the impl.valid waveform is also high.

Conditional checks may only be used when design throughput is 1, and the -valid waveform is sampled every cycle.

Flop Maps

By default, flops are compared with transaction scope. Flop inputs are compared in the beginning cycle of each transaction.

By default, flop ports with the same hierarchical name in both designs are implicitly mapped. Implicit maps are compared in the beginning cycle of a transaction. An implicit map may be removed using the unmap command.

See the create_state_encoding command for information on creating more complex maps between flops.

create_state_encoding create_state_encoding—Creates a state encoding relationship between state in one design and state in the other.

Synopsis create_state_encoding [-name <name>] -module <module> <port_list>

-name <name>
Name for the encoding. If not specified, a unique name is automatically generated. The name is returned as the result of the command.

-module <module>
Name of an encoding module from the cons library.

<port_list>
The port connection list for the module instance, using a Verilog style, either as an ordered port list or a list of named port connections.

The create_state_encoding command establishes a combinational relationship between state in one design and state in the other design, for example, that binary-encoded state in one design is equivalent to one-hot encoded state in the other design.

The name of the state encoding is returned.

Usage

Sometimes flops do not map directly across the designs but have different encodings for the same state. For example, consider a case where the specification design has a two bit flop, spec. a, which needs to be mapped to a 4 bit flop, impl.b in the implementation design where impl.b represents the one-hot encoding of spec.a. The following combinational Verilog module represents the encoding relationship:

```
module one_hot_encoder_4(in, out);
    input[1:0] in;
    output[3:0] out;
    assign out = { in[1] & in[0],
       in[1] & !in[0],
       !in[1] & in[0],
       !in [1] & !in[0]
    }
endmodule
```

The state encoding is established as:

create_state_encoding -name one_hot one_hot_encoder_4 {spec.a impl.b}

The following conditions must be met:

The encoding module must be combinational.

There must be at least one input and one output in the module, and all inputs must be associated with flops in one design, while all outputs must be associated with flops in the other design.

Flops specified in the port list must be either all reset or all not reset in both designs. If all reset, the reset values should satisfy the state encoding.

The types of the flops must exactly match the types specified in the encoding module's port list.

create_waveform create_waveform—Creates a waveform by explicitly specifying a sequence of values or by transforming another waveform.

Synopsis create_waveform -name <name> [ -type <port> | -width <width> ]
[-sample_freq <sample_freq>][-sample_start <sample_start>][-sample_end <sample_end>]
[-hold_interval <hold_interval>][-hold_start <hold_start >][-hold_end <hold_end>]
[-aggregate <waveform_list>] <source_waveform>
-name <name>

Name for the waveform being created. If not specified, a unique name is automatically generated. The name is returned as the result of the command.

-type <port>
For explicit waveforms, specifies this waveform's type to be the same type as the specified port.

-width <width>
For explicit waveforms, specifies a fixed bit width type.

-sample_freq <sample_freq> -sample_start <sample_start> -sample_end <sample_end>
For fixed sampling waveform transformations, the frequency, start, and end parameters which default to 1, 0, and infinity respectively.

-hold_interval <hold_interval> -hold_start <hold_start> -hold_end <hold_end>
For holding waveform transformations, the interval, start, and end holding parameters which default to 1, 0, and infinity respectively.

-aggregate <waveform_list>
For aggregate waveform transformations, a list of waveforms to aggregate. The bits of the first waveform in the list become the most significant bits of the aggregated waveform.

<source_waveform>
For explicit waveforms, a sequence of explicit waveform values. For waveform transformations, the source waveform.

The create_waveform command creates a waveform form explicit values or from transformations or aggregations of other waveforms.

Every port in the design has an implicit waveform associated with it which represents the sequence of values read or written by that port. In commands which use waveforms, the port name can be used to refer to this waveform.

The name of the waveform is returned.

Usage

A waveform describes an infinite sequence of values of a specific type.

The create_waveform command creates a waveform from explicit values or from transformations or aggregations of other waveforms.

Every port of the design has an implicit waveform associated with it which represents the sequence of values read or written by that port. In commands which use waveforms, the port name is used to refer to this waveform.

Explicit Waveforms

An explicit waveform is described using regular expressions, for example:
create_waveform -name waveform0 -width 1 { 1 1 0+ }

Waveform0 is high for two values and then low for all values thereafter. This waveform might describe a one-bit port being held high for two cycles followed by always low values. The name is optional. If not specified, a unique name is assigned by SLEC and returned as the command result.

In addition to concrete values, SLEC has the notion of a symbolic value, S, which represents all possible values of the data type of the waveform. The option width 1 specifies the data type of waveform0 to be a one bit value. So the symbolic value S for waveform0 represents 0 and 1.

All waveform sequences are infinite in length. 0+ at the end of the sequence means that 0 is to be repeated forever for waveform0. If the explicit sequence had a finite sequence of values, then SLEC appends an infinite sequence of symbolic values to complete the waveform. So the following waveforms are identical:
create_waveform -name waveform1a -width 1 { 1 0 1 0 }
create_waveform -name waveform1b -width 1 { 1 0 1 0 S }
create_waveform -name waveform1c -width 1 { 1 0 1 0 S+ }

A subset of values can be described using | and ˆ operators. The | operator is used to specify a choice of values, and the ˆ operator is used to specify any value except the specific value:
create_waveform -name odd_only -width 3 { (1|3|5|7)+ }
create_waveform -name one_non_zero -width 3 { ˆ0 0+ }

A value type can be associated with each waveform. The type can be either a bit vector of fixed width, as in the previous example, or it is specified as the type associated with a port or previously defined waveform:
create_waveform waveform2 -type spec.in0 { 3'b110 3'b010 3'b000+ }
where, in this example, port spec.in0 has a bit width of three.

Transformed Waveforms

A waveform can sample another waveform beginning in a start cycle repeating every frequency cycles until an end cycle using the following arguments:
-sample_freq <sample_freq> -sample_start <sample_start> -sample_end <sample_end>

Waveforms begin with index 0. The default sample parameters are a start of 0, frequency of 1, and end of infinity. For example,
create_waveform -name waveform3 -sample_freq 2 -sample_start 0 \
-sample_end 10 spec.out
creates a waveform which samples the waveform associated with port spec. out starting with the value at index 0, every 2 values, up to index 10. The waveform is symbolic after that.

A waveform can sample and hold another waveform beginning in a source start cycle holding that value for an interval and repeating until a source end cycle is reached using the following arguments:
{[-hold_interval <hold_interval> ][ -hold_start <hold_start> ][ -hold_end <hold_end> ] }

For example,
create_waveform -name waveform6 -hold_interval 2 -hold_start 0 \
-hold_end 7 spec.in
creates a waveform which holds the first value of the spec. in waveform for two cycles, holds the next seven values of spec. in for two cycles each, and becomes symbolic after that.

If no starting cycle is specified, it defaults to cycle 0. If no interval is specified, it defaults to 1 cycle. If no ending cycle is specified, the waveform is sampled forever.

Aggregated Waveforms

Another form of the create_waveform command is used to aggregate other waveforms into one waveform with aggregate type. This is commonly used to bundle individual ports into a combined bus waveform.

The waveform list aggregates the waveforms from most-significant to least-significant values. For example,

```
create_waveform -name waveform9 -aggregate \
  { impl.in3 impl.in2 impl.in1 impl.in0 }
```
aggregates four single bit implementation input ports into a parallel four bit waveform with port in3 treated as the most significant value of the aggregate waveform.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

The invention claimed is:

1. A method for equivalency checking between a first design and a second design, comprising:
   identifying sequential differences between a first design and a second design;
   determining whether the first design and the second design are equivalent, utilizing the identified sequential differences; and
   outputting an indication as to the equivalency based on the determination;
   wherein the sequential differences include differences in an input to output latency of the first design and the second design, differences in a frequency at which inputs of the first design and the second design are sampled, and differences in a frequency at which outputs of the first design and the second design are produced.

2. The method of claim 1, wherein the sequential differences include a protocol associated with the first design and the second design.

3. The method of claim 2, wherein the protocol includes an input/output protocol.

4. The method of claim 2, wherein a first protocol of the first design includes a serial protocol, and a second protocol of the second design includes a parallel protocol.

5. The method of claim 1, wherein the sequential differences include differences in a state mapping associated with the first design and the second design.

6. The method of claim 1, wherein the sequential differences reflect pipelining differences associated with the first design and the second design.

7. The method of claim 1, wherein the sequential differences reflect differences in scheduling of computations associated with the first design and the second design.

8. The method of claim 1, wherein the sequential differences reflect micro-architecture differences associated with the first design and the second design.

9. The method of claim 1, wherein the sequential differences are specified utilizing waveforms.

10. The method of claim 9, wherein the waveforms reflect a time variation of a signal.

11. The method of claim 1, wherein the sequential differences are specified utilizing constraints.

12. The method of claim 11, wherein the constraints are associated with temporal transformations of signals.

13. The method of claim 1, wherein the sequential differences are specified utilizing transactions.

14. The method of claim 13, wherein normal transactions of the first and second designs are proven to be equivalent with respect to a reset transaction.

15. The method of claim 13, wherein normal transactions of the first and second designs are proven to be equivalent without a reset transaction.

16. The method of claim 1, wherein the first design is a system level model design.

17. The method of claim 1, wherein the second design is a register transfer level design.

18. The method of claim 1, wherein it is determined whether the first design and the second design are equivalent by mapping the inputs associated with the first design and the second design utilizing the identified sequential differences, and determining whether the outputs of the first design and the second design are equivalent.

19. The method of claim 1, wherein if it is determined that the first design and the second design are equivalent, a proof of the equivalency is output.

20. The method of claim 1, wherein if it is determined that the first design and the second design are not equivalent, a counter example is output for illustrating the non-equivalency.

21. The method of claim 20, wherein the counter example is utilized for correcting the non-equivalency.

22. The method of claim 1, wherein the input to output latency of the first design and the second design includes a number of cycles for the first design and the second design to process the input and generate an output based on the input.

23. A computer program product embodied on a computer readable medium for equivalency checking between a first design and a second design, comprising:
   computer code for identifying sequential differences between a first design and a second design;
   computer code for determining whether the first design and the second design are equivalent, utilizing the identified sequential differences; and
   computer code for outputting an indication as to the equivalency based on the determination;
   wherein the sequential differences include differences in an input to output latency of the first design and the second design, differences in a frequency at which inputs of the first design and the second design are sampled, and differences in a frequency at which outputs of the first design and the second design are produced.

24. A system for equivalency checking between a first design and a second design, comprising:
   a processor coupled to memory and an output device, the processor executing computer code for determining whether a first design and a second design are equivalent, utilizing a plurality of sequential differences;
   wherein an indication as to the equivalency is output utilizing the output device;
   wherein the sequential differences include differences in an input to output latency of the first design and the second design, differences in a frequency at which inputs of the first design and the second design are sampled, and differences in a frequency at which outputs of the first design and the second design are produced.

25. A data structure embodied on a computer readable medium for equivalency checking between a first design and a second design, comprising:
   an object identifying sequential differences between a first design and a second design;
   wherein the object is utilized for determining whether the first design and the second design are equivalent;
   wherein an indication as to the equivalency is output based on the determination;
   wherein the sequential differences include differences in an input to output latency of the first design and the second design, differences in a frequency at which inputs of the first design and the second design are sampled, and differences in a frequency at which outputs of the first design and the second design are produced.

26. A method for equivalency checking between a first design and a second design, comprising:

mapping inputs associated with a first design and a second design utilizing a plurality of sequential differences;

determining whether outputs of the first design and the second design are equivalent; and outputting an indication as to the equivalency based on the determination;

wherein the sequential differences include differences in an input to output latency of the first design and the second design, differences in a frequency at which the inputs of the first design and the second design are sampled, and differences in a frequency at which the outputs of the first design and the second design are produced.

* * * * *